(12) United States Patent
Han et al.

(10) Patent No.: US 7,360,937 B2
(45) Date of Patent: Apr. 22, 2008

(54) WHITE LIGHT GENERATING UNIT, BACKLIGHT ASSEMBLY HAVING THE SAME AND LIQUID CRYSTAL DISPLAY DEVICE HAVING THE SAME

(75) Inventors: Byung-Woong Han, Gwangyeock-si (KR); Kyu-Seok Kim, Yongin-si (KR); Young-Bee Chu, Suwon-si (KR); Sang-Hee Lee, Yongin-si (KR); Young-Hee Park, Busan-si (KR); Jong-Nam Lee, Anuang-si (KR)

(73) Assignee: Samsung Electronics Co., Ltd. (KR)

( * ) Notice: Subject to any disclaimer, the term of this patent is extended or adjusted under 35 U.S.C. 154(b) by 160 days.

(21) Appl. No.: 11/239,819

(22) Filed: Sep. 30, 2005

(65) Prior Publication Data
US 2006/0072315 A1  Apr. 6, 2006

(30) Foreign Application Priority Data
Oct. 5, 2004 (KR) .................. 10-2004-0079182

(51) Int. Cl.
*F21V 8/00* (2006.01)
(52) U.S. Cl. .................. 362/608; 362/84; 362/612; 362/613; 362/624
(58) Field of Classification Search ................ 362/611, 362/612, 613, 621, 608, 600, 84
See application file for complete search history.

(56) References Cited

U.S. PATENT DOCUMENTS

| 6,065,845 A * | 5/2000 | Miyazaki ................ 362/26 |
| 2004/0228115 A1 * | 11/2004 | Jacobson et al. ............ 362/84 |

* cited by examiner

*Primary Examiner*—Laura Tso
(74) *Attorney, Agent, or Firm*—Cantor Colburn LLP

(57) ABSTRACT

A white light generating unit includes an LED structure and a lens structure. The LED structure generates a light. The lens structure has a convex lens or a concave lens. The lens structure has a fluorescent member that receives the light from the LED structure to emit a white light.

31 Claims, 11 Drawing Sheets

WHITE LIGHT GENERATING UNIT, BACKLIGHT ASSEMBLY HAVING THE SAME AND LIQUID CRYSTAL DISPLAY DEVICE HAVING THE SAME

The present application claims priority to Korean Patent Application No. 2004-79182 filed on Oct. 5, 2004, the contents of which are herein incorporated by reference in its entirety.

BACKGROUND OF THE INVENTION

1. Field of the Invention

The present invention relates generally to a white light generating unit, a backlight assembly having the white light generating unit and a liquid crystal display device having the white light generating unit. More particularly, the present invention relates to a white light generating unit capable of generating a white light using a light emitting diode structure, a backlight assembly having the white light generating unit and a liquid crystal display device having the white light generating unit.

2. Description of the Related Art

Generally, a liquid crystal display (LCD) device displays images using electrical and optical characteristics of liquid crystal installed therein. The LCD device has various advantages, for example, a thin thickness, small volume and light weight as compared with a cathode ray tube (CRT) device making it ideal for use in a variety of items, such as portable computers, communication devices, television sets, etc.

The LCD device includes a liquid crystal controlling unit that controls the liquid crystal, and a light providing unit that provides light to the liquid crystal. For example, the LCD device includes an LCD panel serving as the liquid crystal controlling unit and a backlight assembly functioning as the light providing unit.

The backlight assembly is employed for providing a planar light of a uniform luminance into the LCD panel. When such a light is incident into the LCD panel from the backlight assembly, a uniform image is displayed through an entire effective display area of the LCD panel.

The backlight assembly may include a light source that generates a light (e.g., a cold cathode fluorescent lamp (CCFL) having a cylindrical structure or a light emitting diode (LED) having a dot structure) and a light guiding plate. The LED is usually employed for a display device having a relatively small display unit, such as a mobile communication device, to thereby reduce a volume and a power consumption thereof.

A light generated from the LED typically corresponds to a point light. The point light is changed into a planar light in the light guiding plate to exit the light guiding plate through a light-exiting face. The light emitted from the light guiding plate is provided into the LCD panel to thereby display an image through the LCD panel. Preferably, the light emitted from the light guiding plate may be a white light, and thus the LED may correspond to a white LED or the light generated from the LED may be converted into the white light.

A conventional small or medium-sized display device includes a white LED. However, in the conventional display device, a light generated from the white LED is incident into the light guiding plate at a relatively small divergence angle resulting in a dark portion on the light guiding plate. Thus, the conventional display device requires a number of the white LEDs in order to maximize the effective display area of the display device. In addition, the white LED has a complex structure and is very expensive so that the conventional display device including the white LED may be increased in size thereby potentially increasing its cost of manufacturers.

SUMMARY OF THE INVENTION

The aforementioned disadvantages are overcome or eliminated by a white light generating unit capable of generating a white light using an LED structure, a backlight assembly having the above-mentioned white light generating unit, and a liquid crystal display device having the above-mentioned white light generating unit.

In one aspect of the present invention, a white light generating unit includes an LED structure and a lens structure. The LED structure generates a light. The lens structure includes a fluorescent member that generates a white light after receiving the light from the LED structure. For example, the LED structure includes a blue LED emitting a blue light or an ultraviolet (UV) LED emitting a UV light. When the blue LED emits the blue light, the fluorescent member includes a yellow fluorescent material. Alternatively, the fluorescent member may include a red fluorescent material and a green fluorescent material. When the UV LED emits the ultraviolet light, the fluorescent member includes a red fluorescent material, a green fluorescent material and a blue fluorescent material. The lens, for example, is a convex lens or a concave lens. The lens structure may include a diffusing agent that diffuses the light provided from the LED structure.

In another aspect of the present invention, a backlight assembly includes a light generating unit, a light guiding plate, a lens structure and a receiving container. The light generating unit includes an LED structure having at least one LED generating a light. The light guiding plate guides the light emitted from the light generating unit and emits the light. The lens structure has at least one lens disposed between the light generating unit and the light guiding plate. The lens structure has a fluorescent member that receives the light from the light generating unit to emit a white light. The receiving container receives the light generating unit, the light guiding plate, and the lens structure.

In still another aspect of the present invention, an LCD device includes a backlight assembly and an LCD panel. The backlight assembly includes a light generating unit including an LED structure having at least one LED that generates a light, a light guiding plate that guides the light emitted from the light generating unit and emits the light, a lens structure having at least one lens disposed between the light generating unit and the light guiding plate and having a fluorescent member that receives the light from the light generating unit to emit a white light, and a receiving container that receives the light generating unit, the light guiding plate and the lens structure. The LCD panel receives the light to display an image.

In accordance with exemplary embodiments, a lens structure having at least one lens is employed in a white light-generating unit so that a divergence angle of a light that propagates from an LED structure having at least one LED into a light guiding plate may be increased. Thus, a dark portion of the light guiding plate may be decreased due to the increased divergence angle. In addition, the LED structure does not require a fluorescent member therefore, the size of the LED structure may be decreased.

BRIEF DESCRIPTION OF THE DRAWINGS

The above and other features and advantage points of the present invention will become more apparent by describing in detailed exemplary embodiments thereof with reference to the accompanying drawings, in which.

DETAILED DESCRIPTION OF THE INVENTION

Figure 1:
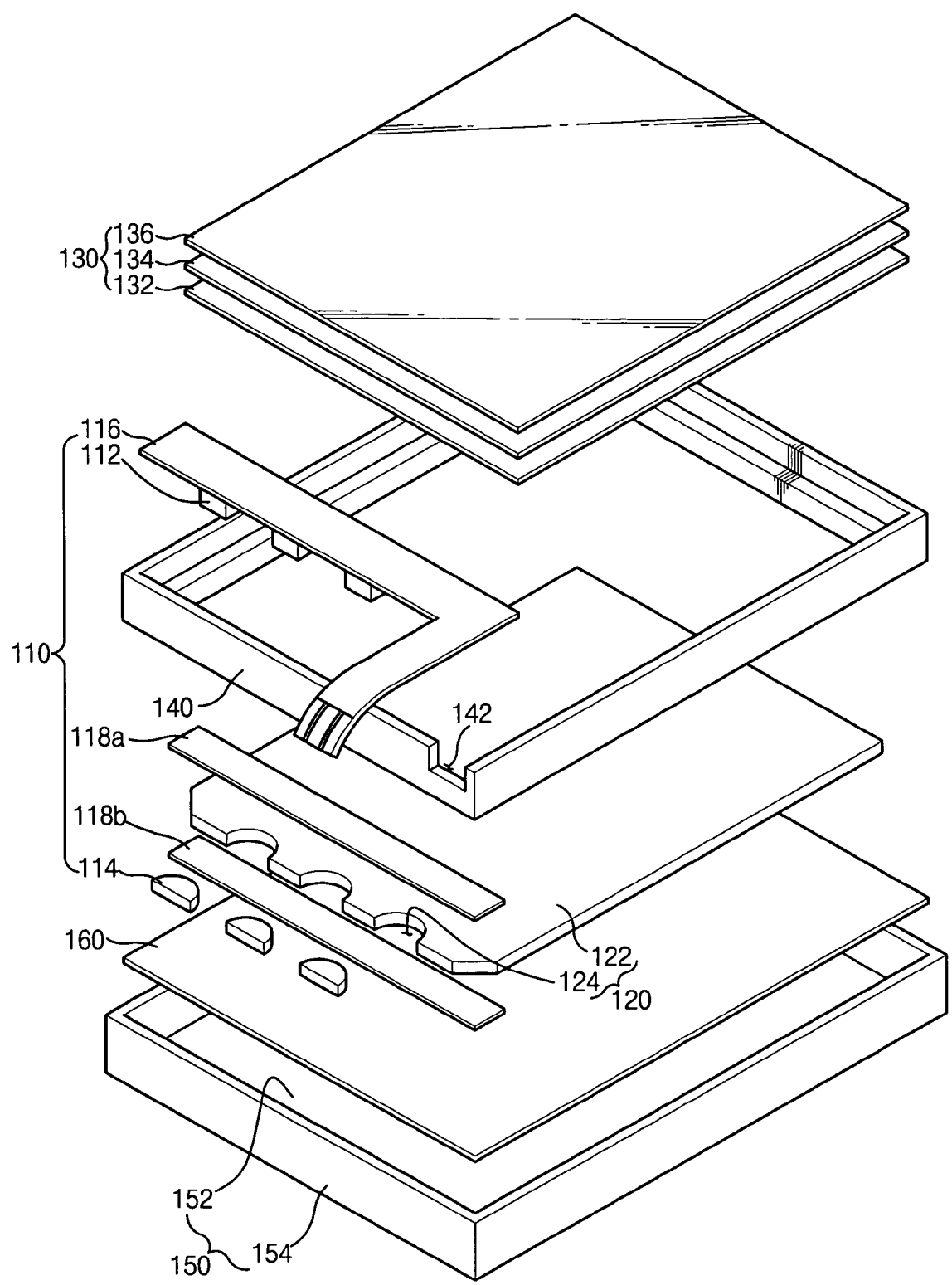
FIG. 1 is an exploded perspective view illustrating an exemplary embodiment of a backlight assembly according to the present invention.

The present invention now will be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like reference numerals refer to similar or identical elements throughout.

Figure 2:
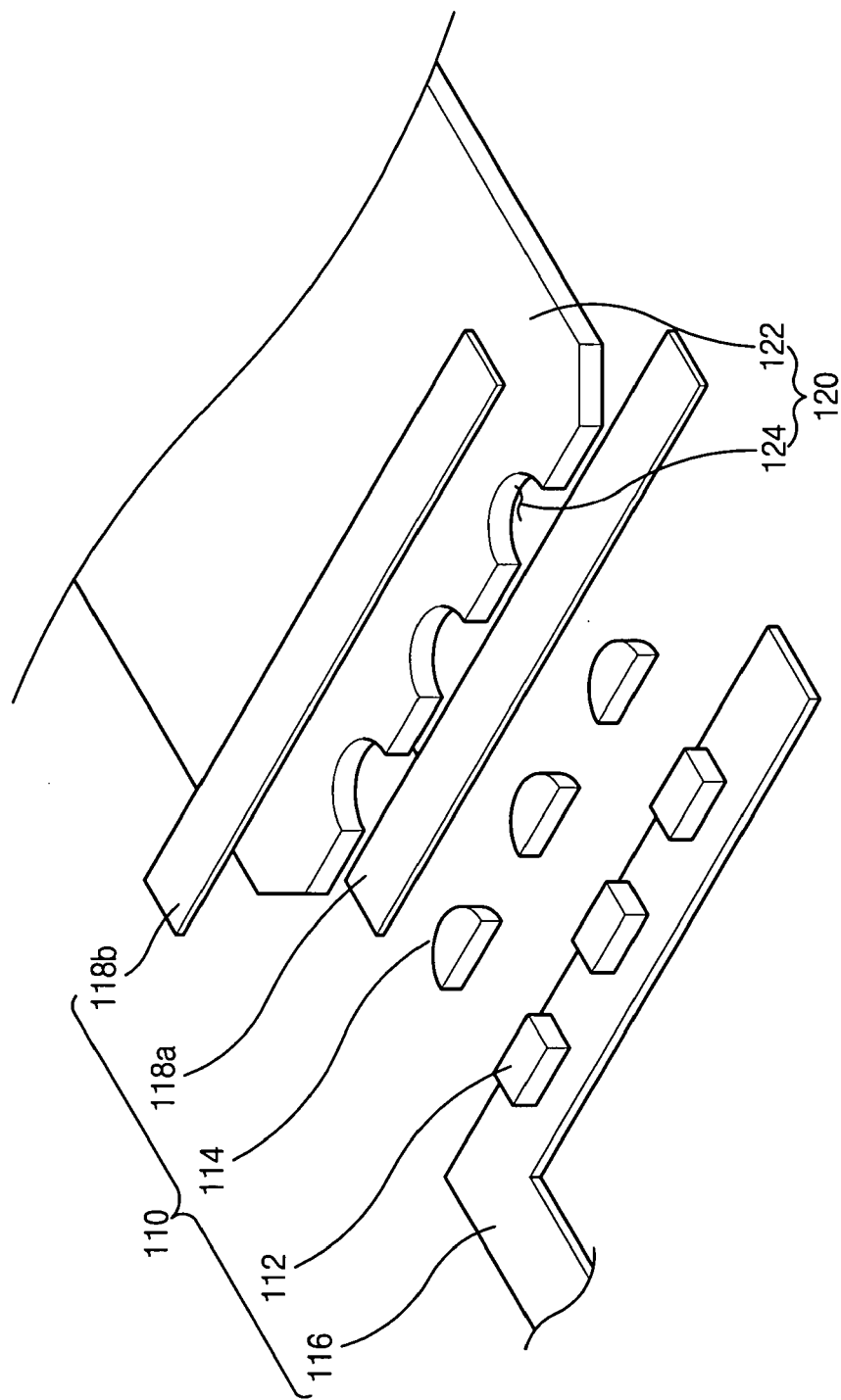
FIG. 2 is an enlarged perspective view illustrating an exemplary embodiment of a white light generating unit and a light guiding plate of the backlight assembly shown in FIG. 1.
Figure 3:
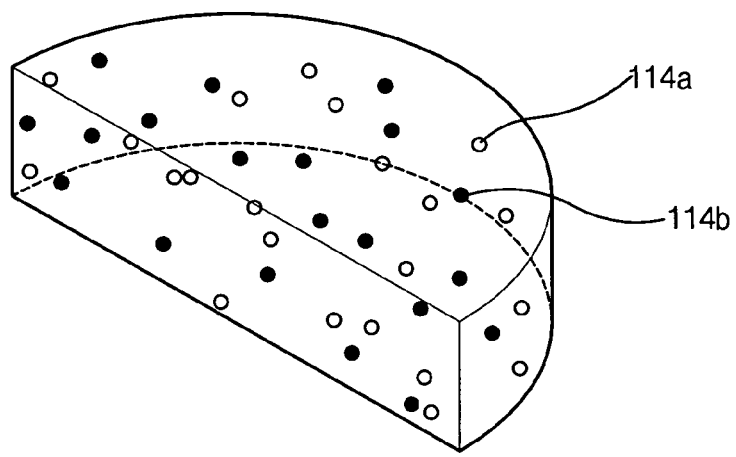
FIG. 3 is a projected perspective view illustrating an exemplary embodiment of a lens structure of the white light generating unit shown in FIG. 1.

FIG. 1 is an exploded perspective view illustrating an exemplary embodiment of a backlight assembly according to the present invention. FIG. 2 is an enlarged perspective view illustrating an exemplary embodiment of a white light generating unit and a light guiding plate of FIG. 1. FIG. 3 is a projected perspective view illustrating an exemplary embodiment of a lens structure of the white light generating unit of FIG. 1.

Referring to FIGS. 1 through 3, a backlight assembly 100 includes a white light generating unit 110, a light guiding plate 120, an optical member 130, a mold frame 140 and a receiving container 150.

The white light generating unit 110 includes an LED structure 112 having at least one LED, a lens structure 114 having at least one lens, and a printed circuit board (PCB) 116. The number of the LEDs included in the LED structure 112 may correspond to the number of the lens included in the lens structure 114. For example, if the LED structure 112 has three LEDs then the lens structure 114 includes three lenses.

The LED structure 112 is positioned beneath the PCB 116. The LED structure 112 generates a light. The LED structure 112, for example, includes at least one blue LED that emits a blue light. Alternatively, the LED structure 112 may include at least one ultraviolet (UV) LED that emits a UV light.

The lens structure 114, for example, may include at least one convex lens. That is, the lens of the lens structure 114 may have a convex shape. The lens structure 114 includes a fluorescent member 114a. The fluorescent member 114a may be in the form of a powder. After the fluorescent member 114a receives the light generated from the LED structure 112, the fluorescent member 114a emits a white light toward the light guiding plate 120. When the LED structure 112 includes at least one blue LED, the fluorescent member 114a includes a yellow fluorescent material so that the lens structure 114 emits the white light. Alternatively, the fluorescent member 114a may include a red fluorescent material and a green fluorescent material. When the LED structure 112 includes at least one UV LED, the fluorescent member 114a includes a red fluorescent material, a green fluorescent material and a blue fluorescent material, thereby emitting the white light from the lens structure 114.

The lens structure 114 may further include a diffusing agent 114b. The diffusing agent 114b diffuses the light provided from the LED structure 112 toward the light guiding plate 120. The diffusing agent 114b, for example, may be in the form of a powder. The diffusing agent 114b may include one of stone powder and an acryl resin. The acryl resin may include polymethyl methacrylate (PMMA). Alternatively, the diffusing agent 114b may include stone powder and an acryl resin.

The lens structure 114 may include a curing agent. The curing agent may cure the fluorescent member 114a and/or the diffusing agent 114b included in the lens structure 114.

The PCB 116 is disposed on the LED structure 112. The PCB 116, for example, may correspond to a flexible printed circuit (FPC) board having a high flexibility. The PCB 116 applies a predetermined voltage to the LED structure 112 so as to generate the light from the LED structure 112.

As shown in FIG. 2, the white light generating unit 110 may further include two reflective bands 118a and 118b. The reflective bands 118a and 118b are disposed on a first face and beneath a second face of the lens structure 114, respectively. For example, the first and second faces of the lens structure 114 correspond to an upper face and a lower face of the lens structure 114, respectively. Alternatively, the white light generating unit 110 may include one reflective band disposed on one of the first and the second faces of the lens structure 114. The reflective bands 118a and 118b reflect a light deviated from the lens structure 114 back toward the lens structure 114.

The white light generating unit 110 may include a stiffener (not shown) disposed on the PCB 116. The stiffener includes an adhesive material for attaching the PCB 116 to the mold frame 140.

The white light generating unit 110 may include a lamp cover (not shown). The lamp cover encloses the LED structure 112 and also converges the light generated from the LED structure 112 toward the light guiding plate 120.

The light guiding plate 120 guides the white light emitted from the white light generating unit 110 along a substantially horizontal direction, and then emits the white light toward the optical member 130. The white light corresponds to a planar light. The light guiding plate 120 includes a light guiding plate body 122, and at least one receiving groove 124 is formed at a side of the light guiding plate body 122.

The light guiding plate body 122 may have a substantially flat plate shape. When the point light is emitted from the LED structure 112 into the light guiding plate body 122, the light is uniformly reflected from the light guiding plate body 122 having a relatively wide area to thereby form a planar light. The light guiding plate 120 has the flat plate shape so that the light guiding plate body 122 has a uniform thickness. That is, the thickness of the light guiding plate body 122 is substantially identical from one end portion thereof adjacent to the LED structure 112 to another end portion thereof corresponding to the one end portion.

Alternatively, the light guiding plate 120 may have a wedge shape. Thus, a thickness of the light guiding plate body 122 may be gradually thinner from one end portion thereof to the other end portion corresponding to the one end portion thereof.

Referring again to FIGS. 1 and 2, at least one receiving groove 124 is formed on a side of the light guiding plate body 122 so that the lens structure 114 is disposed in the receiving groove 124. For example, three receiving grooves 124 are provided at the side portion of the light guiding plate body 122 when the lens structure 114 has three lenses. The receiving groove 124 has a shape corresponding to the lens structure 114 to properly receive the lens structure 114.

The optical member 130 is disposed on the light guiding plate 120. The optical member 130 includes a diffusion sheet 132, a prism sheet 134 and a dual brightness enhancement film (DBEF) 136.

A light emitted from the light guiding plate 120 has somewhat low uniformity of luminance. If the backlight assembly 100 included the light guiding plate 120 only, the backlight assembly 100 may not provide a high quality light for displaying an image. To solve the aforementioned problems, the optical member 130 includes the diffusion sheet 132, the prism sheet 134 and the DBEF 136. The diffusion sheet 132 enhances luminance uniformity of the light emitted from the light guiding plate 120, and the prism sheet 134 improves a viewing angle of a displayed image. In addition, the DBEF 136 increases luminance and enlarges a viewing angle of a displayed image.

The optical member 130 may include a protection sheet (not shown). The protection sheet may prevent the prism sheet 134 from being scratched. The protection sheet may also prevent an occurrence of the moire fringes that may be incurred by using two prism sheets 134. The moire fringes means that wave patterns of a light are shown on a screen by an interference of the light. The protection sheet may diffuse a light to thereby increase the viewing angle of the displayed image even though the prism sheet 134 may reduce the viewing angle of the displayed image.

The mold frame 140 may have a frame shape. The mold frame 140 receives and supports the optical member 130 disposed thereon. The mold frame 140 also receives and supports the light guiding plate 120 placed in a lower portion thereof. The PCB 116 is disposed on a side portion of the mold frame 140. A recess 142 is formed at the side portion of the mold frame 140 to provide a passage through which the PCB 116 may be extended toward an exterior of the mold frame 140.

The receiving container 150 receives the white light generating unit 110, the light guiding plate 120, the optical member 130 and the mold frame 140. The receiving container 150 includes a bottom plate 152 and a plurality of sidewalls 154. The sidewalls 154 are integrally formed with the bottom plate 152, and protruded from the bottom plate 152 to provide a receiving space. The white light generating unit 110, the light guiding plate 120, the optical member 130 and the mold frame 140 are received in the receiving space.

The backlight assembly 100 may further include a reflective sheet 160. The reflective sheet 160 is disposed on the bottom plate 152 of the receiving container 150. The reflective sheet 160 reflects a light leaked from the light guiding plate 120 back toward the light guiding plate 120.

Hereinafter, a white light generating mechanism in the white light generating unit 110 will be described more fully with reference to the accompanying drawings.

Figure 4:
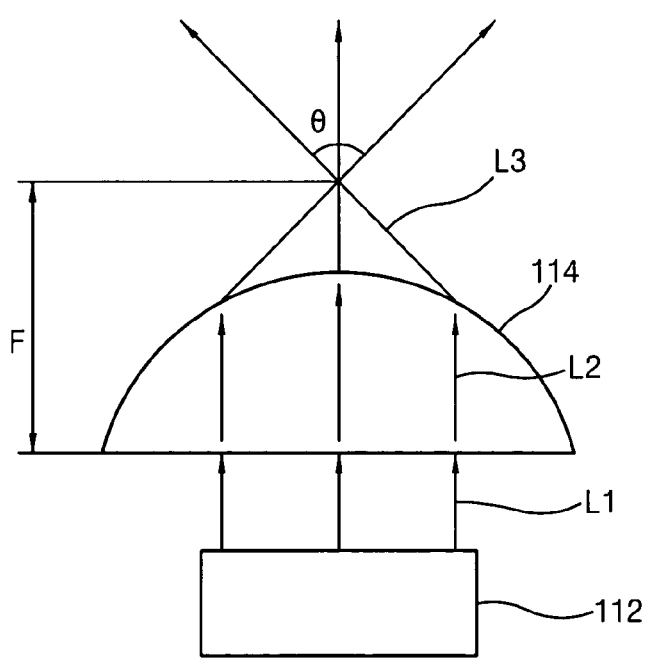
FIG. 4 is a plan view illustrating a white light generating mechanism in the white light generating unit shown in FIG. 1.

FIG. 4 is a plan view illustrating a white light generating mechanism in the white light generating unit 110 of FIG. 1.

Referring to FIG. 4, a first light L1 indicates a light generated from the LED structure 112, a second light L2 represents a light passing through the lens structure 114, and a third light L3 indicates a light emitted from the lens structure 114. When the lens structure 114 includes at least one convex lens, the third light L3 converges on a focus of the lens structure 114. When a focusing distance of the lens structure 114 is F, the third light L3 converges on the focus of the lens structure 114 apart from a side portion of the lens structure 114 by the focusing distance F. After the third light L3 converges, the third light L3 diverges at a predetermined divergence angle θ. The focusing distance F may depend upon optical characteristics of the lens structure 114. When the lens structure 114 has a short focusing distance F, the third light L3 has a large divergence angle θ. On the other hand, when the lens structure 114 has a long focusing distance F, the third light L3 has a small divergence angle θ.

When the LED structure 112, for example, includes at least one blue LED, the first light L1 generated from the LED structure 112 to be incident into the lens structure 112 corresponds to a blue light. Here, the lens structure 114 may include the fluorescent member 114a having the yellow fluorescent material. Alternatively, the lens structure 114 may include the fluorescent member 114a having the red fluorescent material and the green fluorescent material. The red and green fluorescent materials may generate a white light with a predetermined combination ratio between the red and green fluorescent materials. Therefore, the third light L3 emitted from the lens structure 114 is a white light.

Alternatively, when the LED structure 112 includes at least one UV LED, the first light L1 generated from the LED structure 112 to be incident into the lens structure 114 corresponds to a UV light. The lens structure 114 may include the fluorescent member 114a having the red fluorescent material, the green fluorescent material and the blue fluorescent material. The red, green and blue fluorescent materials may generate a white light with a predetermined combination ratio thereof. Therefore, the third light L3 emitted from the lens structure 114 is a white light.

When the lens structure 114 includes a diffusing agent 114b, the diffusing agent 114b diffuses the second light L2 passing through the lens structure 114. Thus, the third light L3 emitted from the lens structure 114 may have a much larger divergence angle θ.

Hereinafter, when a light is incident into the light guiding plate 120, a path of the light will be described more fully with reference to the accompanying drawings.

Figure 5:
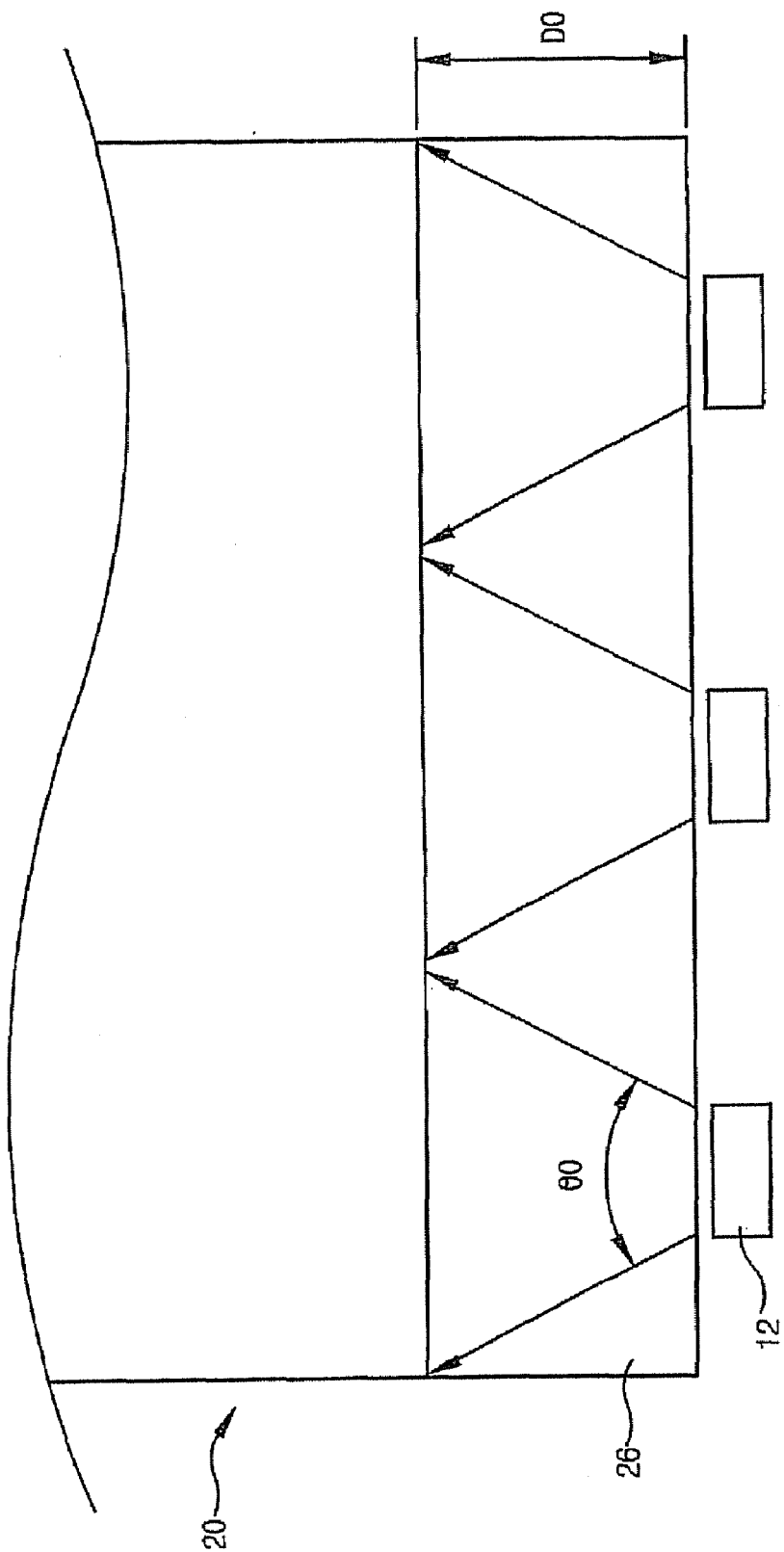
FIG. 5 is a plan view illustrating a path of a light generated from a conventional LED structure of the prior art and propagated to a conventional light guiding plate of the prior art.
Figure 6:
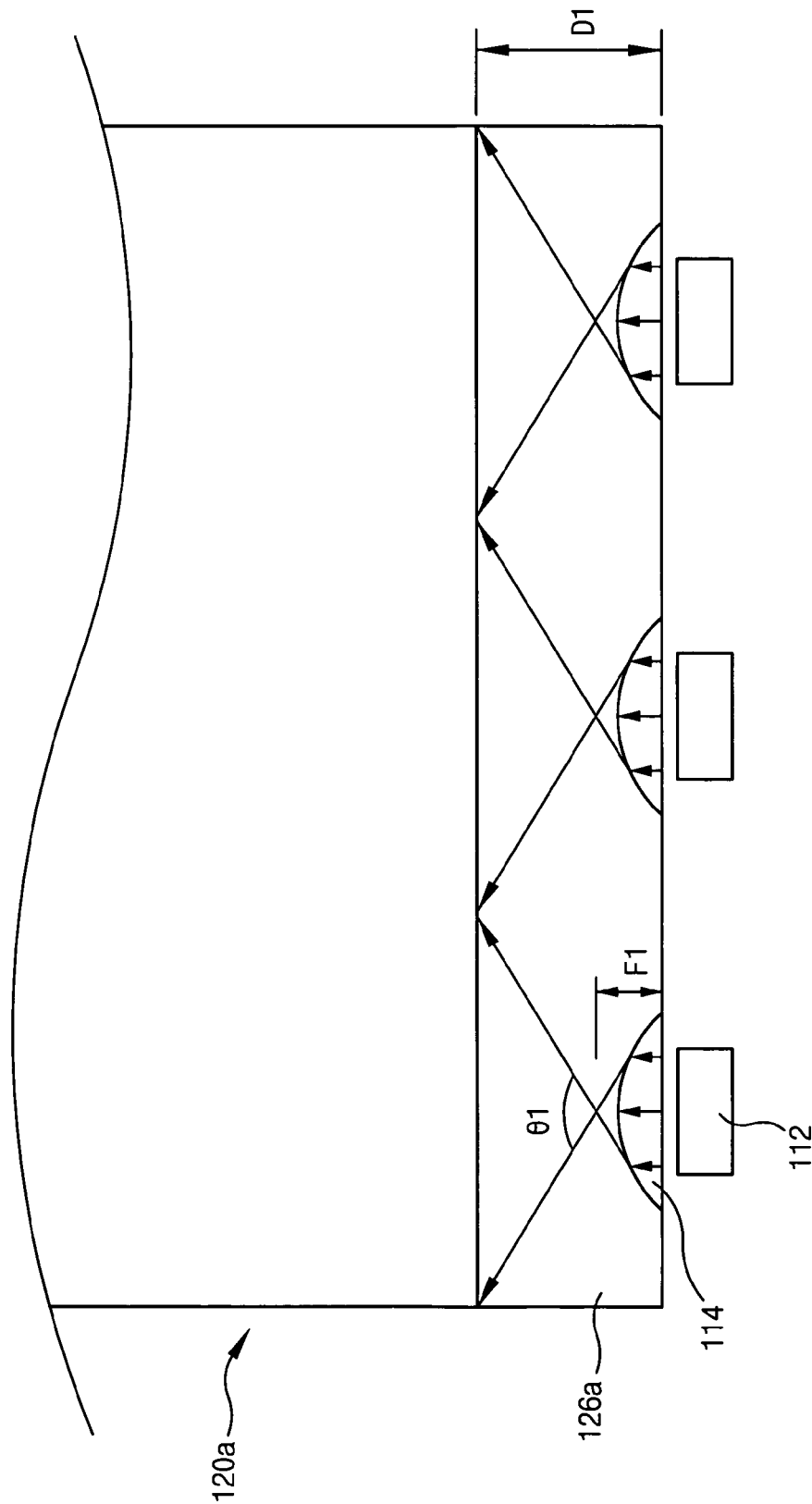
FIG. 6 is a plan view illustrating a path of a light generated from an LED structure and propagated to a light guiding plate.

FIG. 5 is a plan view illustrating a path of a light generated from a conventional LED structure of the prior art and propagated to a conventional light guiding plate of the prior art and FIG. 6 is a plan view illustrating a path of a light generated from an LED structure and propagated to a light guiding plate. FIG. 5 illustrates a path of a light generated from an LED structure when a backlight assembly does not include a lens structure. FIG. 6 illustrates a path of a light generated from an LED structure when a backlight assembly includes a lens structure.

Referring to FIG. 5, when the backlight assembly does not include the lens structure, a light generated from an LED structure 12 is incident into a light guiding plate 20 to diverge at a predetermined divergence angle $\theta 0$.

The light generated from the LED structure 12 is emitted at an angle of 180°. However, the light is substantially incident into the light guiding plate 20 at an angle of about 120°. When the light generated from the LED structure 12 is incident into the light guiding plate 20 at an angle of about 120°, the light passing through the light guiding plate 20 diverges at the divergence angle $\theta 0$. According to Snell's law, the divergence angle $\theta 0$ is about 70° to about 80° so that the light guiding plate 20 has a region through which the light does not pass. That is, the light guiding plate 20 has a dark portion 26 that may not be used for a display area. When the backlight assembly does not include the lens structure, the dark portion 26 of the light guiding plate 20 corresponds to a distance D0 from a side portion of the light guiding plate 20 as shown in FIG. 5.

By contrast, when the backlight assembly includes the lens structure 114, as shown in FIG. 6, a light generated from an LED structure 112 passes through the lens structure 114. The light passing through the lens structure 114 is propagated in the light guiding plate 120a, and then converges on a focus of the lens structure 114 apart from a side portion of the light guiding plate 120a by a focusing distance F1. Then, the light diverges at a predetermined divergence angle $\theta 1$.

In particular, the light generated from the LED structure 112 is not directly incident into the light guiding plate 120a, but converges at a position apart from the side of the light guiding plate 120a by a predetermined focusing distance F1. The converged light diverges at the divergence angle $\theta 1$. When the focusing distance F1 is long, the divergence angle $\theta 1$ is small compared to a divergence angle in a backlight assembly not having the lens structure. Thus, a dark portion 126a of the light guiding plate 120a may be increased in comparison with a dark portion in the backlight assembly not having the lens structure. However, when the focusing distance F1 is short enough, the divergence angle $\theta 1$ may be controlled to have a large value. Thus, the dark portion 126a of the light guiding plate 120a may be decreased. Therefore, the light guiding plate 120a has an effective display area, wider than that of the light guide plate of the backlight assembly that does not have the lens structure.

Figure 7:
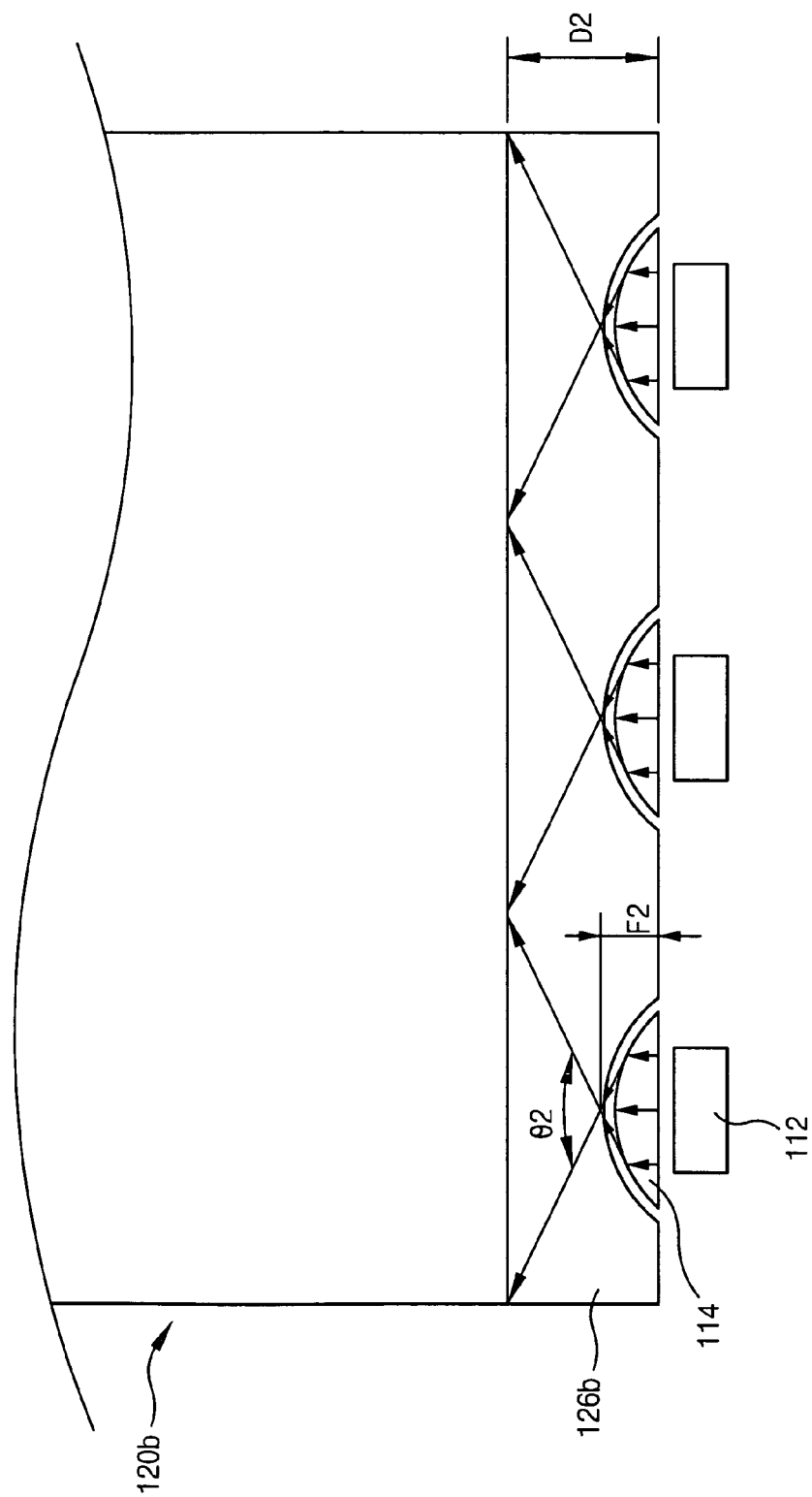
FIG. 7 is a plan view illustrating another exemplary embodiment of a backlight assembly according to the present invention.

FIG. 7 is a plan view illustrating another exemplary embodiment of a backlight assembly according to the present invention. FIG. 7 illustrates a path of a light propagating in a light guiding plate via a lens structure from an LED structure when the lens structure and the light guiding plate are apart from each other. The backlight assembly of the present embodiment is substantially identical to the backlight assembly of Embodiment 1 except for a construction of the lens structure and the light guiding plate. Thus, any further description of substantially similar elements will be omitted.

Referring to FIG. 7, the backlight assembly includes a lens structure 114 and a light guiding plate 120b. When the lens structure 114 and the light guiding plate 120b are apart from each other, a light generated from an LED structure 112 passes through the lens structure 114. After the light passes through the lens structure 114, the light propagates through an air layer positioned between the lens structure 114 and the light guiding plate 120b. After the light passes through the air layer, the light converges on a focus in the light guiding plate 120b, and then diverges at a predetermined divergence angle $\theta 2$.

When the light generated from the LED structure 112 is incident into the light guiding plate 120b, the light emitted from the lens structure 114 is incident into the air layer. Since a refractive index of the air layer is smaller than a refractive index of the light guiding plate 120b, the incident light in the air layer is refracted by an angle substantially higher than that of the light illustrated in FIG. 6. The incident light in the light guiding plate 120b converges on a focus in the light guiding plate 120b so that the light diverges at the divergence angle $\theta 2$.

When a width of the air layer is relatively thin, the divergence angle $\theta 2$ is substantially identical to the divergence angle $\theta 1$ illustrated in FIG. 6. Thus, a focusing distance F2 of the present embodiment is shorter than the focusing distance F1 shown in FIG. 6. As a result, a dark portion 126b of the light guiding plate 120b has an area relatively narrower than the dark portion 126a of the light guiding plate 120a shown in FIG. 6, and a distance D2 indicating the dark portion 126b of the light guiding plate 120b is shorter than the distance D1 indicating the dark portion 126a of the light guiding plate 120a illustrated in FIG. 6.

According to the present embodiment, the light generated from the LED structure 112 is not directly incident into the light guiding plate 120b. The light passing through the lens structure 114 converges at the position apart from a side portion of the light guiding plate 120b by a predetermined focusing distance F2. The converged light diverges at the divergence angle $\theta 2$. When the focusing distance F2 is short enough, the divergence angle $\theta 2$ may be controlled to have a large value. Thus, the dark portion 126a may be decreased. Furthermore, the focusing distance F2 becomes much shorter when the light passes through the air layer so that the dark portion 126b is decreased in comparison with the dark portion 126a illustrated in FIG. 6. Therefore, the light guiding plate 120b has an effective display area wider than that of the light guiding plate 120a shown in FIG. 6.

Figure 8:
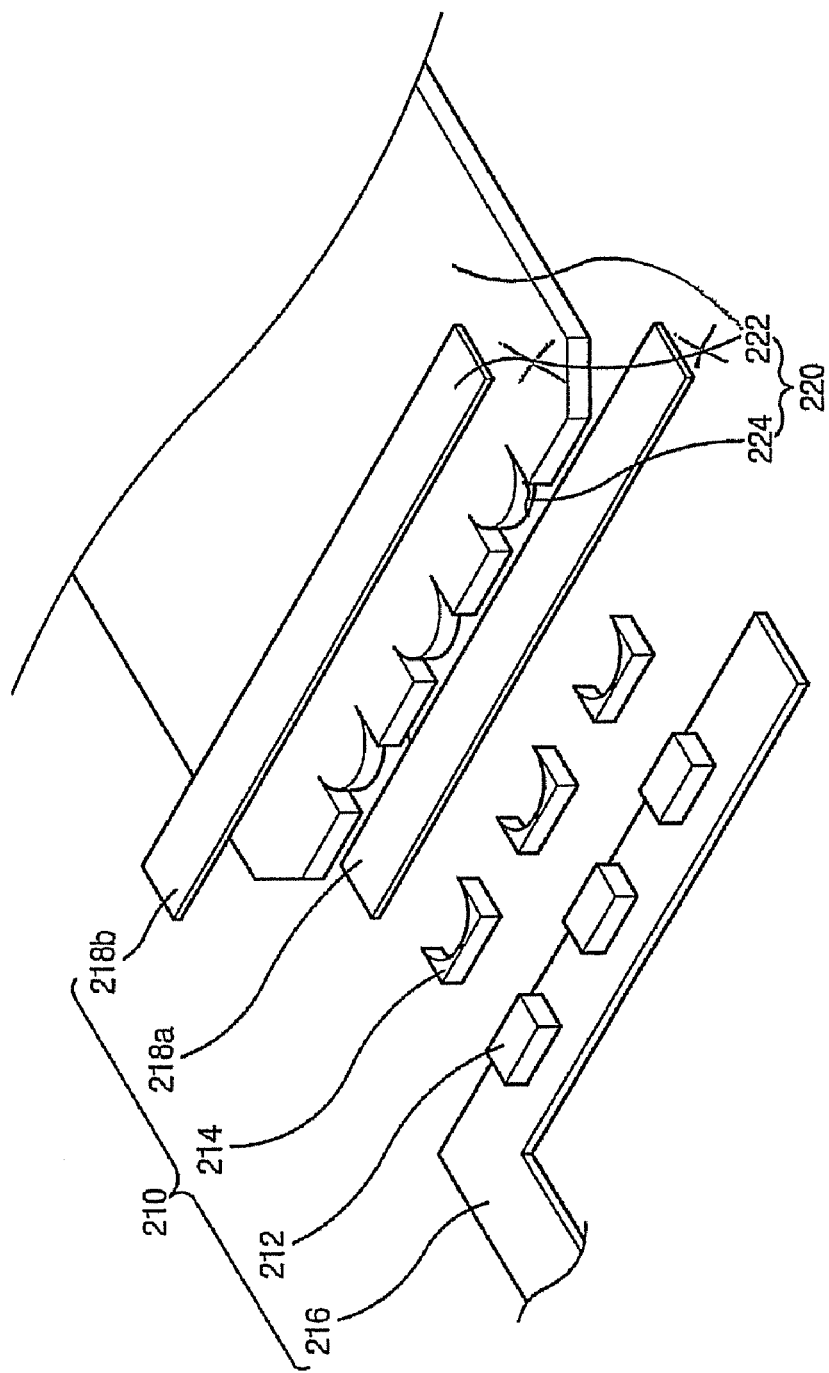
FIG. 8 is an exploded perspective view illustrating another exemplary embodiment of a white light generating unit and a light guiding plate of a backlight assembly according to the present invention.
Figure 9:
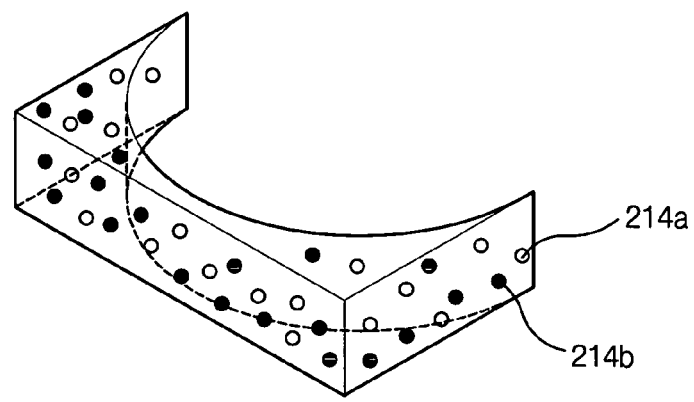
FIG. 9 is a projected perspective view illustrating an exemplary embodiment of a lens structure of the white light generating unit shown in FIG. 8.

FIG. 8 is an exploded perspective view illustrating another exemplary embodiment of a white light generating unit 210 and a light guiding plate 220 of a backlight assembly according to the present invention. FIG. 9 is a projected perspective view illustrating an exemplary embodiment of a lens structure of the white light generating unit in FIG. 8. The backlight assembly of the present embodiment is substantially identical to the backlight assembly of FIG. 1, except for a construction of the lens and the light guiding plate. Thus, any further description for the substantially same elements will be omitted.

The white light generating unit 210 includes an LED structure 212 having at least one LED, a lens structure 214 having at least one lens and a printed circuit board (PCB) 216. Referring to FIGS. 8 and 9, a lens structure 214, for example, includes at least one concave lens. The lens structure 214 also includes a fluorescent member 214a. The fluorescent member 214a may be in the form of a powder. The fluorescent member 214a receives the light generated from an LED structure 212, and then emits a white light. When the LED structure 212 includes at least one blue LED, the fluorescent member 214a includes a yellow fluorescent material so that the fluorescent member 214a emits the white light. Alternatively, the fluorescent member 214a may include a red fluorescent material and a green fluorescent material. When the LED structure 212 includes at least one UV LED, the fluorescent member 214a includes a red fluorescent material, a green fluorescent material and a blue fluorescent material to thereby emit the white light.

The lens 214 may further include a diffusing agent 214b. The diffusing agent 214b diffuses the light provided from the LED structure 212. The diffusing agent 214b, for example, may be in the form of a powder. The diffusing agent 214b may include one of stone powder and an acryl resin. The acryl resin may include polymethyl methacrylate (PMMA). Alternatively, the diffusing agent 214b may include stone powder and an acryl resin.

The lens structure 214 may further include a curing agent. The curing agent may harden the fluorescent member 214a or the diffusing agent 214b. Alternatively, the curing agent may harden the fluorescent member 214a and the diffusing agent 214b. As shown in FIG. 8, the white light generating unit 210 may further include two reflective bands 218a and 218b. The light guiding plate 220 includes a light guiding plate body 222, and at least one receiving groove 224 is formed at a side of the light guiding plate body 222.

Hereinafter, a white light generating mechanism in the white light generating unit 210 will be described more fully with reference to the accompanying drawing.

Figure 10:
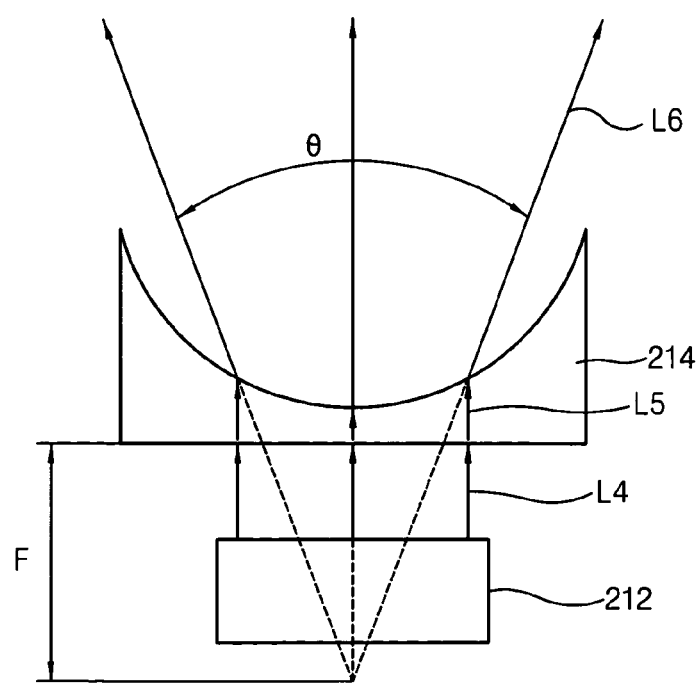
FIG. 10 is a plan view illustrating a white light generating mechanism in the white light generating unit shown in FIG. 8.

FIG. 10 is a plan view illustrating a white light generating mechanism in the white light generating unit 210 shown in FIG. 8.

Referring to FIG. 10, a fourth light L4 refers to a light generated from the LED structure 212, a fifth light L5 indicates a light passing through the lens structure 214, and a sixth light L6 represents a light emitted from the lens structure 214. When the lens structure 214 has at least one concave lens, the sixth light L6 diverges from a focus of the lens structure 214. When a focusing distance of the lens structure 214 is F, the sixth light L6 diverges from the focus of the lens structure 214 apart from a side portion of the lens structure 214 by the focusing distance F. The focusing distance F may depend upon optical characteristics of the lens structure 214. When the lens structure 214 has a short focusing distance F, the sixth light L6 has a large divergence angle $\theta$. When the lens structure 214 has a long focusing distance F, the sixth light L6 has a small divergence angle $\theta$.

When the LED structure 212, for example, includes at least one blue LED, the fourth light L4 generated from the LED structure 212 to be incident into the lens structure 214 is a blue light. Here, the lens structure 214 may include the fluorescent member 214a having a yellow fluorescent material as described above. Alternatively, the lens structure 214 may include the fluorescent member 214a having a red fluorescent material and a green fluorescent material. The red and green fluorescent materials may generate a white light with a predetermined combination ratio thereof. Therefore, the sixth light L6 emitted from the lens structure 214 is a white light.

Alternatively, when the LED structure 212 includes at least one UV LED, the fourth light L4 generated from the LED structure 212 to be incident into the lens structure 214 is a UV light. The lens structure 214 may include the fluorescent member 214a having a red fluorescent material, a green fluorescent material and a blue fluorescent material. The red, green and blue fluorescent materials may generate a white light with a predetermined combination ratio thereof. Therefore, the sixth light L6 emitted from the lens structure 214 is a white light.

When the lens structure 214 further includes diffusing agent 214b, the diffusing agent 214b diffuses the fifth light L5 passing through the lens structure 214. Thus, the sixth light L6 emitted from the lens structure 214 may have a much larger divergence angle $\theta$.

Hereinafter, when a light is incident into the light guiding plate 220, a path of the light will be described more fully with reference to the accompanying drawing.

Figure 11:
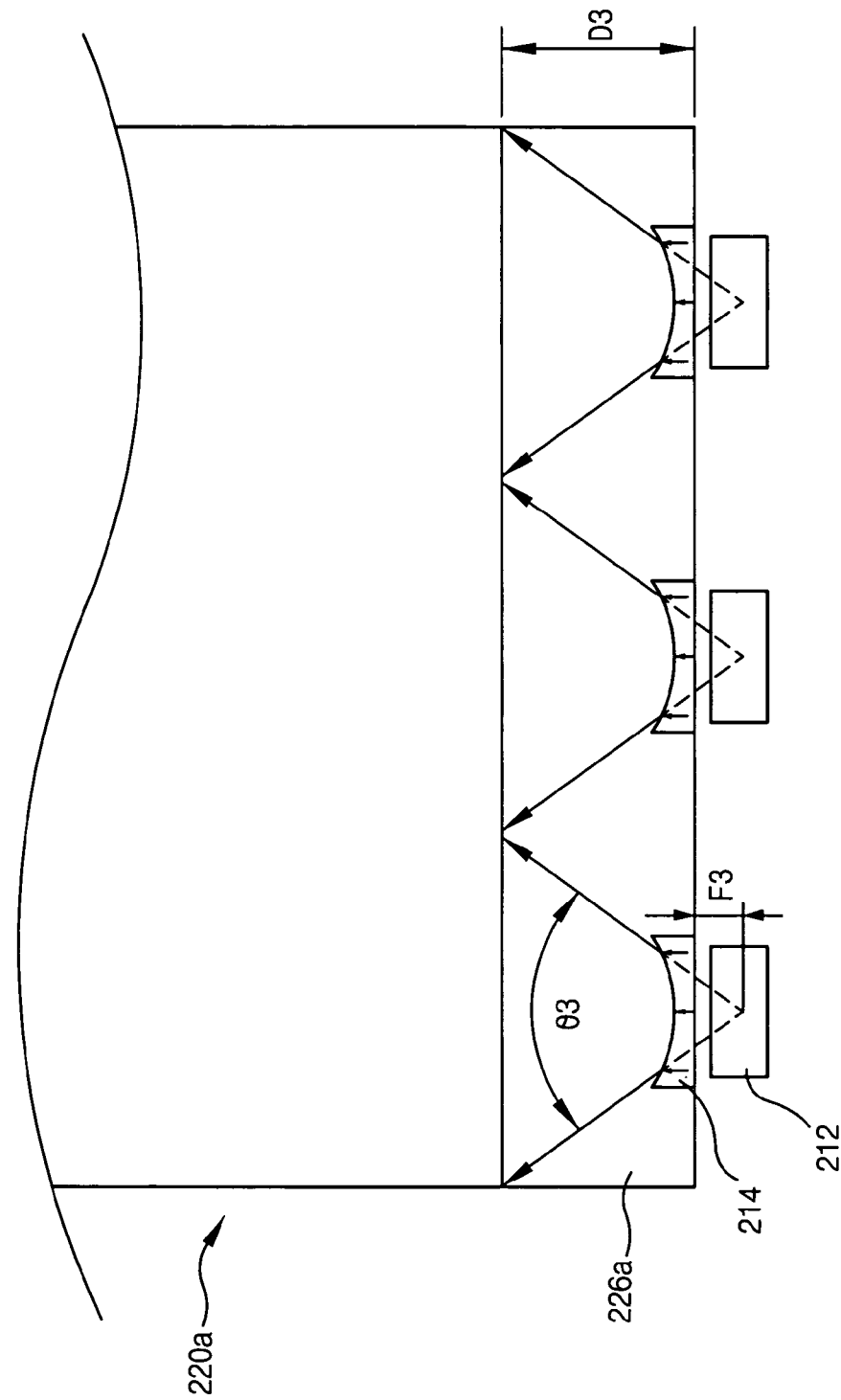
FIG. 11 is a plan view illustrating a path of a light generated from an LED structure and propagated to a light guiding plate.

FIG. 11 is a plan view illustrating a path of a light generated from an LED structure and propagated to a light guiding plate.

Referring to FIG. 11, a light generated from an LED structure 212 passes through the lens structure 214. The light passing through the lens structure 214 is propagated to the light guiding plate 220a, and then diverges from the focus apart from a side portion of the light guiding plate 220a by a focusing distance F3 at a predetermined divergence angle $\theta 3$.

In particular, the light generated from the LED structure 212 is not directly incident into the light guiding plate 220a. The light passing through the lens structure 214 diverges from a position apart from a side portion of the light guiding plate 220a by a predetermined focusing distance F3. Thus, a dark portion 226a is decreased compared with a light guiding plate provided with a lens structure having a convex lens. The divergence angle $\theta 3$ may be controlled to have a large value by controlling the focusing distance F3 so that the dark portion 226a may be decreased. Therefore, the light guiding plate 220a has an effective display area wider than that of a light guide plate provided with the lens structure having the convex lens.

Referring again to FIG. 8, at least one receiving groove 224 of the light guiding plate 220 is formed to have a shape corresponding to that of the lens structure 214. When the lens structure 214 includes at least one concave lens, the receiving groove 224 is formed in a shape corresponding to the concave lens. Here, the lens structure 214 may make contact with the receiving groove 224.

Figure 12:
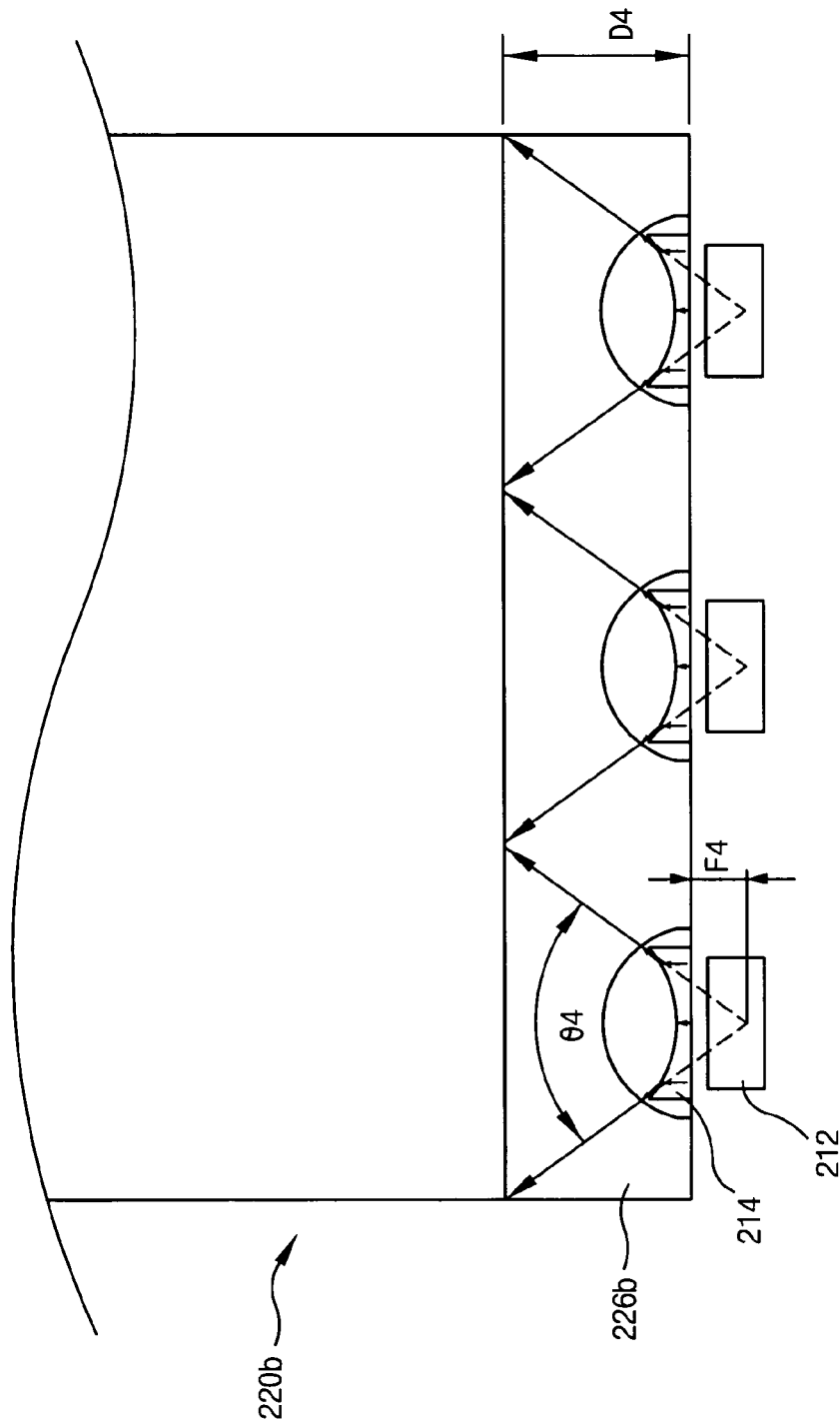
FIG. 12 is a plan view illustrating another exemplary embodiment of a backlight assembly according to the present invention.

FIG. 12 is a plan view illustrating another exemplary embodiment of a backlight assembly according to the present invention. FIG. 12 illustrates a path of a light propagating in a light guiding plate via a lens from an LED structure when the lens structure and the light guiding plate are apart from each other. The backlight assembly of the present embodiment is substantially identical to the backlight assembly of Embodiment 3 except for a construction of the lens and the light guiding plate. Thus, any further description for substantially similar elements will be omitted.

Referring to FIG. 12, when the lens structure 214 and the light guiding plate 220b are apart from each other, a light generated from the LED structure 212 passes through the lens structure 214. After passing through the lens structure 214, the light passes through an air layer between the lens structure 214 and the light guiding plate 220b. After passing through the air layer, the light diverges from a focus at a predetermined divergence angle $\theta 4$.

When the light generated from the LED structure 212 is incident into the light guiding plate 220b, the light emitted from the lens structure 214 is incident into the air layer. A refractive index of the air layer is smaller than a refractive index of the light guiding plate 220b. Thus, the incident light in the air layer refracts more than that of the light in FIG. 11. The incident light in the light guiding plate 220b diverges from a focus in the light guiding plate 220b at the divergence angle θ4.

When a width of the air layer is relatively thin, the divergence angle θ4 is substantially identical to the divergence angle θ3 illustrated in FIG. 11. Thus, a focusing distance F4 of the present embodiment is shorter than the focusing distance F3 in FIG. 11. As a result, a dark portion 226b has an area narrower than the dark portion 226a shown in FIG. 11, and a distance D4 indicating the dark portion 226b is shorter than the distance D3 indicating the dark portion 226a illustrated in FIG. 11.

According to the present embodiment, the light generated from the LED structure 212 is not directly incident into the light guiding plate 220b. The light passing through the lens structure 214 diverges from the position apart from a side portion of the light guiding plate 220b by a predetermined focusing distance F4 at the divergence angle θ4. When the focusing distance F4 is short enough, the divergence angle θ4 may be controlled to have a large value. Thus, the dark portion 226b may be decreased as compared with a light guiding plate provided without the lens structure. In addition, a light diverges at a position nearer to the LED structure 212 as compared with a backlight assembly having a lens structure with a convex lens. Furthermore, the focusing distance F4 becomes much shorter when the light passes through the air layer, so that the dark portion 226b is decreased as compared with the dark portion 226a shown in FIG. 11. Therefore, the light guiding plate 220b has an effective display area wider than that of the light guiding plate 220a illustrated in FIG. 11.

Figure 13:
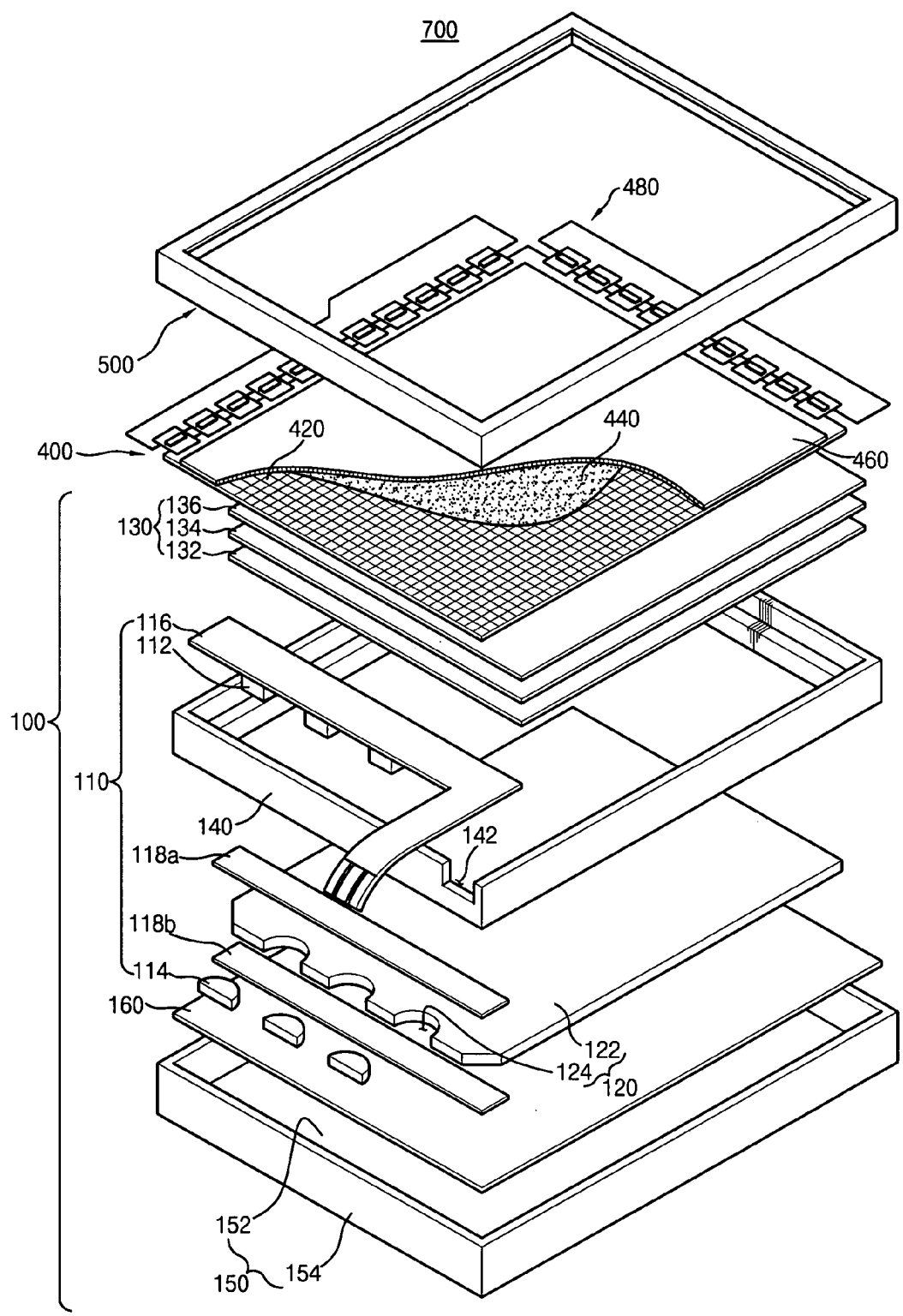
FIG. 13 is an exploded perspective view illustrating an exemplary embodiment of an LCD device according to the present invention.

FIG. 13 is an exploded perspective view illustrating an exemplary embodiment of an LCD device according to the present invention.

Referring to FIG. 13, an LCD device 700 includes a backlight assembly 100, an LCD panel 400 and a chassis 500.

In the present embodiment, the backlight assembly 100 is substantially identical to the backlight assembly described with reference to FIG. 1. Thus, any further description for substantially similar same elements will be omitted.

The LCD panel 400 displays an image thereon using a light generated from the backlight assembly 100. The LCD panel 400 includes a thin film transistor (TFT) substrate 420, a liquid crystal layer 440, a color filter substrate 460 and a driving module 480.

The TFT substrate 420 may include a pixel electrode (not shown), a TFT (not shown), a gate line (not shown) and a data line (not shown). The pixel electrode may have a matrix shape. The TFT applies a driving voltage to the pixel electrode.

The color filter substrate 460 may include a color filter (not shown) corresponding to the pixel electrode, and a common electrode formed on the color filter.

The liquid crystal layer 440 is interposed between the TFT substrate 420 and the color filter substrate 460. The driving module 480 drives the LCD panel 400.

The chassis 500 encloses edge portions of the LCD panel 400 and is combined with the receiving container 150. The chassis 500 protects the LCD panel 400 from damage due to external impact. The chassis 500 also prevents the LCD panel 400 from drifting.

The backlight assembly 100 of LCD device 700 has a lens structure of a convex shape. Alternatively, a backlight assembly having a lens structure of a concave shape may be employed for the LCD device 700.

According to the present embodiment, the LCD device 700 includes an LED structure 112 without an additional fluorescent material so that a size of the LCD device 700 may be decreased. In addition, the LCD device 700 includes a white light generating unit 110 instead of a white LED so that manufacturing costs of the LCD device 700 may be greatly decreased.

As described above, exemplary embodiments provide a lens structure having at least one lens that is used in a white light generating unit, thereby precisely controlling a divergence angle of a light emitted from an LED structure to propagate in a light guiding plate. Thus, the divergence angle may be increased. As a result, a dark portion of the light guiding plate may be decreased in accordance with increases of the divergence angle.

In addition, the LED structure does not require any additional fluorescent material so that a size of the LED structure may be decreased. Likewise, a size of both of a backlight assembly having the LED structure as well as the LCD device having the LED structure may be decreased.

Furthermore, the white light generating unit is used instead of a very expensive white LED, thereby greatly decreasing manufacturing costs of a backlight assembly having the LED structure and an LCD device having the LED structure.

Although exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A white light generating unit comprising:
   a light emitting diode (LED) structure generating a light; and
   a lens structure having a fluorescent member that generates a white light after receiving the light from the LED structure, the lens structure being separably assembled with the LED structure.

2. The white light generating unit of claim 1, wherein the LED structure comprises a blue LED.

3. The white light generating unit of claim 2, wherein the fluorescent member comprises a yellow fluorescent material.

4. The white light generating unit of claim 2, wherein the fluorescent member comprises a red fluorescent material and a green fluorescent material.

5. The white light generating unit of claim 1, wherein the LED structure comprises an ultraviolet (UV) LED.

6. The white light generating unit of claim 5, wherein the fluorescent member comprises a red fluorescent material, a green fluorescent material and a blue fluorescent material.

7. The white light generating unit of claim 1, wherein the lens structure comprises a convex lens.

8. The white light generating unit of claim 1, wherein the lens structure comprises a concave lens.

9. The white light generating unit of claim 1, wherein the lens structure comprises a diffusing agent that diffuses the light generated from the LED structure.

10. The white light generating unit of claim 9, wherein the diffusing agent is in the form of a powder.

11. The white light generating unit of claim 10, wherein the diffusing agent includes at least one of stone powder and an acryl resin.

12. The white light generating unit of claim 1, wherein the fluorescent member is in the form of a powder.

13. The white light generating unit of claim 12, wherein the lens structure comprises a curing agent that hardens the fluorescent member.

14. The white light generating unit of claim 1, further comprising a reflective band disposed on at least one face of the lens structure to reflect a light deviated from the lens structure back to the lens structure.

15. A backlight assembly, comprising:
a light generating unit including an LED structure having at least one LED that generates a light;
a light guiding plate that guides the light emitted from the light generating unit and emits the light;
a lens structure having at least one lens disposed between the light generating unit and the light guiding plate, and the lens structure having a fluorescent member that receives the light from the light generating unit to emit a white light and being separably assembled with the LED structure; and
a receiving container that receives the light generating unit, the light guiding plate, and the lens structure.

16. The backlight assembly of claim 15, wherein the LED structure comprises a blue LED and the fluorescent member comprises a yellow fluorescent material.

17. The backlight assembly of claim 15, wherein the LED structure comprises a blue LED and the fluorescent member comprises a red fluorescent material and a green fluorescent material.

18. The backlight assembly of claim 15, wherein the LED structure comprises a UV LED and the fluorescent member comprises a red fluorescent material, a green fluorescent material and a blue fluorescent material.

19. The backlight assembly of claim 15, wherein the lens structure comprises one of a convex lens and a concave lens.

20. The backlight assembly of claim 15, further comprising a reflective band disposed on at least one face of the lens structure to reflect a light deviated from the lens structure back into the lens structure.

21. The backlight assembly of claim 15, wherein the lens structure comprises a diffusing agent that diffuses the light provided from the light generating unit.

22. The backlight assembly of claim 21, wherein the lens structure further comprises a curing agent that hardens the diffusing agent.

23. The backlight assembly of claim 15, further comprising a receiving groove formed on a side portion of the light guide plate to receive the lens structure.

24. The backlight assembly of claim 23, wherein the receiving groove has a shape corresponding to that of the lens structure.

25. The backlight assembly of claim 24, wherein the lens structure makes contact with the receiving groove.

26. The backlight assembly of claim 23, wherein the lens structure is spaced apart from the receiving groove.

27. A liquid crystal display (LCD) device, comprising:
a backlight assembly comprising:
a light generating unit including an LED structure having at least one LED that generates a light;
a light guiding plate that guides the light emitted from the light generating unit and emits the light;
a lens structure having at least one lens disposed between the light generating unit and the light guiding plate and the lens structure having a fluorescent member that receives the light from the light generating unit to emit a white light and being separably assembled with the LED structure; and
a receiving container that receives the light generating unit, the light guiding plate, and the lens structure; and
an LCD panel that receives the light to display an image.

28. The LCD device of claim 27, wherein the LED structure comprises a blue LED, and the fluorescent member comprises a yellow fluorescent material.

29. The LCD device of claim 27, wherein the LED structure comprises a blue LED, and the fluorescent member comprises a red fluorescent material and a green fluorescent material.

30. The LCD device of claim 27, wherein the LED structure comprises a UV LED, and the fluorescent member comprises a red fluorescent material, a green fluorescent material and a blue fluorescent material.

31. The LCD device of claim 27, wherein the lens structure comprises one of a convex lens and a concave lens.

* * * * *